(12) United States Patent
Crippa et al.

(10) Patent No.: US 7,630,238 B2
(45) Date of Patent: Dec. 8, 2009

(54) PAGE BUFFER FOR MULTI-LEVEL NAND ELECTRICALLY-PROGRAMMABLE SEMICONDUCTOR MEMORIES

(76) Inventors: Luca Crippa, Via Manzoni, 66, I-20040 Busnago (MI) (IT); Rino Micheloni, Via Como, 8, I-22078 Turate (CO) (IT)

( * ) Notice: Subject to any disclaimer, the term of this patent is extended or adjusted under 35 U.S.C. 154(b) by 136 days.

(21) Appl. No.: 11/821,131

(22) Filed: Jun. 21, 2007

(65) Prior Publication Data
US 2008/0123411 A1    May 29, 2008

(30) Foreign Application Priority Data
Jun. 21, 2006    (EP)    ................................ 06115809

(51) Int. Cl.
*G11C 11/34*    (2006.01)
(52) U.S. Cl. ........................... 365/185.03; 365/189.05; 365/203
(58) Field of Classification Search ............ 365/185.03, 365/189.05, 203, 204, 185.13, 189.01, 230.08, 365/189.03, 189.09
See application file for complete search history.

(56) References Cited

U.S. PATENT DOCUMENTS

| 5,751,634 | A | 5/1998 | Itoh | |
|---|---|---|---|---|
| 7,336,538 | B2* | 2/2008 | Crippa et al. | 365/185.12 |
| 7,359,245 | B2* | 4/2008 | Kim et al. | 365/185.18 |
| 2006/0104112 | A1 | 5/2006 | Hosono et al. | |
| 2008/0080260 | A1* | 4/2008 | Seong | 365/189.05 |

OTHER PUBLICATIONS

Examination Report from European Patent Application No. 06115809.3 mailed Mar. 18, 2008, 5 pgs.
Further Examination Report from European Patent Application No. 06115809.3 mailed Dec. 5, 2008, 4 pgs.
European Search Report, EP06115809, Nov. 28, 2006.

* cited by examiner

*Primary Examiner*—Dang T Nguyen
(74) *Attorney, Agent, or Firm*—Blakely, Sokoloff, Taylor & Zafman LLP

(57) ABSTRACT

A page buffer for an electrically programmable memory is provided. The page buffer includes a plurality of memory cells, a plurality of distinct programming states defined for each memory cell, corresponding to a number N>=2 of data bits storable in each memory cell, wherein the data bits include at least a first data bits group and a second data bits group and at least one read/program unit having a coupling line operatively associable with selected memory cells.

10 Claims, 9 Drawing Sheets

PAGE BUFFER FOR MULTI-LEVEL NAND ELECTRICALLY-PROGRAMMABLE SEMICONDUCTOR MEMORIES

PRIORITY CLAIM

This application claims priority from European patent application No. 06115809.3, filed Jun. 21, 2006, which is incorporated herein by reference.

TECHNICAL FIELD

An embodiment of the present invention generally relates to the field of solid-state memories, particularly to semiconductor memories and, even more particularly, to non-volatile semiconductor memories. Specifically, an embodiment of the invention relates to non-volatile memories that are electrically programmable.

BACKGROUND

Non-volatile memory devices (shortly, non-volatile memories) are commonly used in several applications that need the data stored in the memory device to be preserved even in absence of the power supply.

Within the class of non-volatile memories, electrically alterable memories, particularly electrically programmable and erasable memories, such as flash memories, have become very popular in applications in which the data to be stored are not immutable (as it might be case of, e.g., a consolidated microcode for a microprocessor), being instead necessary from time to time to store new data, or to update the data already stored.

Typically, a memory device includes a plurality of memory cells, arranged for example in rows and columns so as to form a matrix of memory cells ("memory matrix").

Depending on the way the memory cells in the memory matrix are interconnected, two classes of flash memories can be identified: those having a so-called NOR architecture, or NOR Flash memories, and those having a so-called NAND architecture, shortly referred to as NAND Flash memories. Roughly speaking, in a NOR architecture the memory cells of a same matrix column are connected in parallel to a same bit line, whereas in a NAND architecture groups of memory cells of a same matrix column are serially interconnected so as to form respective strings (sometimes also referred to as "stacks"); several strings are connected, in parallel to each other, to a same bit line.

Compared to NOR Flash memories, NAND Flash memories are more compact (a lower number of electrical contacts in the memory matrix is required), and they are also better suited for applications such as file storage.

In the NAND architecture, the memory space is ideally partitioned into a plurality of memory pages, each page corresponding to a group of memory cells that, in operation, are accessed, i.e., read or written simultaneously, i.e., in parallel to each other. The number of memory cells in each group determines the size (i.e., the number of bits) of the memory page. Memory pages of 8192 (8K) cells are rather typical, but larger memory pages are also encountered, for example of 16384 (16K) cells.

A circuit arrangement referred to as "page buffer" is typically provided in a NAND flash memory for managing the operations of reading the information stored in the memory cells of a selected memory page, or altering the content of the memory page (i.e., writing new information thereinto, or erasing the memory page). In very general terms, the page buffer includes a buffer register of size equal to that of the memory page, wherein data read (in parallel) from the memory cells of a selected page are temporarily stored, before being serially outputted in chunks of, e.g., eight or sixteen bits, depending on the number of I/O terminals of the memory; similarly, when data are to be written into the memory, the page buffer is replenished with data received serially in said eight- or sixteen-bits chunks, and, after the page buffer has eventually been filled, the data are written in parallel into the memory cells of a selected memory page.

The basic operations that a page buffer usually allows performing on the memory cells are a "page read" (an operation involving reading data from a selected memory page), a "page program" (writing data into a selected memory page), and an "erase" operation, wherein the information content of the memory cells is erased.

Memory devices capable of storing one bit of information per memory cell are referred to as "two-level" memories, whereas memory devices capable of storing more than just one information bit per memory cell are referred to as "multi-level" memories. In particular, four-level memories are known, whose memory cells can be programmed in any one of four different programming states, each one associated with a corresponding logic value of the pair of bits they are adapted to store. Usually, the programming state of a memory cell is defined by the threshold voltage value of a MOS transistor included in the memory cell; in a memory cell adapted to store two bits, the threshold voltage values of the MOS transistor included in the generic memory cell may take one of four different values (or values within four different ranges of values).

A typical choice is to associate the values "11", "10", "01" and "00" to increasing threshold voltage values, the logic value "11" being associated with the programming state having the lowest threshold voltage value (erased state), and the other logic values being associated, in succession, with programming states having increasing threshold voltage values. In this case, reading data stored in a two-bit memory cell may require up to three read accesses thereto, using different references.

A solution known in the art for reducing the number of read accesses necessary to retrieve the data stored in a two-bit memory cell consists of partitioning the memory space in such a way that the data stored into each single memory cell belongs to two memory pages (each page corresponding to one bit among the two stored in the memory cell) and using a different correspondence between stored logic values and programming states, exploiting the Gray coding. In this way, the stored logic values are associated with the programming states (ordered in increasing threshold voltage values) according to the binary sequence "11", "10", "00", "01", the logic value "11" being associated to the erased state, and the other logic values being associated in succession with programming states having increasing threshold voltage values. A distinctive advantage of using the Gray coding is that "adjacent" programming states (in terms of threshold voltage values) correspond to logic values that differ from each other by only one bit. This feature implies a series of advantages.

An example of page buffers for NAND memories adopting the Gray coding is for example provided in the published U.S. Patent Application 2002/0126531, which is incorporated by reference.

A page buffer for a two-bit memory typically includes a plurality of read/program units, each one adapted to be operatively associated with a selected memory cell to be read or programmed. Each read/program unit includes at least a pair of volatile storage elements, each volatile storage element of the pair corresponding to one bit of the pair each memory cell is adapted to store. The page program operation performed by such a page buffer involves the transfer of data between the two volatile storage elements, for example during a data load procedure of the datum to be programmed. For this purpose, the outputs of each of said two volatile storage elements are coupled with a corresponding common node, that requires to be brought to the supply voltage and to be kept into a floating condition before the execution of the abovementioned data transfer.

It has been observed that the presence of such common node may cause problems during the data transfer between the volatile storage elements.

In fact, precharging the common node to the supply voltage and maintaining said voltage while the common node is kept in a floating condition may be unsafe for different reasons. For example, the voltage of the common node may fall, because of unavoidable leakage effects. Moreover, when the common node is in the floating condition, its voltage may vary in an unpredictable way, since it is strongly affected by the voltage of other signal lines in the page buffer, capacitively coupled therewith. These drawbacks may affect the correct working of the page buffer, because they may invalidate the page program operations.

Furthermore, every time the common node has to be charged/discharged, it may be necessary to move a substantial amount of electrical charge, wasting electrical power. In fact, assuming that each common node has associated therewith a capacitive load of the order of 50-100 fF, and assuming that the page buffer includes 16K-32K read/program units, a similar number of common nodes have to be charged in parallel, and the average current consumption (with a charging time of 100-200 nsec and with the supply voltage equal to 3 Volts) may vary from 12 mA to 100 mA.

SUMMARY

An improved implementation of a page buffer performs data transfer between the volatile storage elements avoiding the use of the common line, overcoming the above-mentioned problems.

An embodiment of the page buffer includes a plurality of memory cells and a plurality of distinct programming states defined for each memory cell, corresponding to a number N>=2 of data bits storable in each memory cell, wherein the data bits include at least a first data bits group and a second data bits group. The page buffer further includes at least one read/program unit having a coupling line operatively associable with selected memory cells. The read/program unit is adapted to at least temporarily store data bits read from or to be written into selected memory cells and comprises programming state change enabling means for selectively enabling a change in programming state of a selected memory cell by causing the coupling line to take one among a program enabling potential and a program inhibition potential. The programming state change enabling means comprises reading means for retrieving, from the selected memory cell, an indication of an existing data value already stored in the second group of data bits. The programming state change enabling means further comprises receiving means for receiving an indication of a target data value to be stored in the first group of data bits of the selected memory cell, combining means activatable during a combining phase for combining the indication of the existing data value with the indication of the received target data value, so as to obtain a modified indication corresponding to a target programming state for the memory cell and conditioning means for causing a potential of the coupling line to take the program enabling potential or the program inhibition potential depending on the modified indication. The combining means includes a coupling electrical path between the reading means and the receiving means, said coupling electrical line being kept isolated from the coupling electrical path during said combining phase.

BRIEF DESCRIPTION OF THE DRAWINGS

One or more embodiments of the invention as well as features and advantages thereof, will be best understood by reference to the following detailed description, given purely by way of a non-restrictive indication, to be read in conjunction with the accompanying drawings.

DETAILED DESCRIPTION

Figure 1:
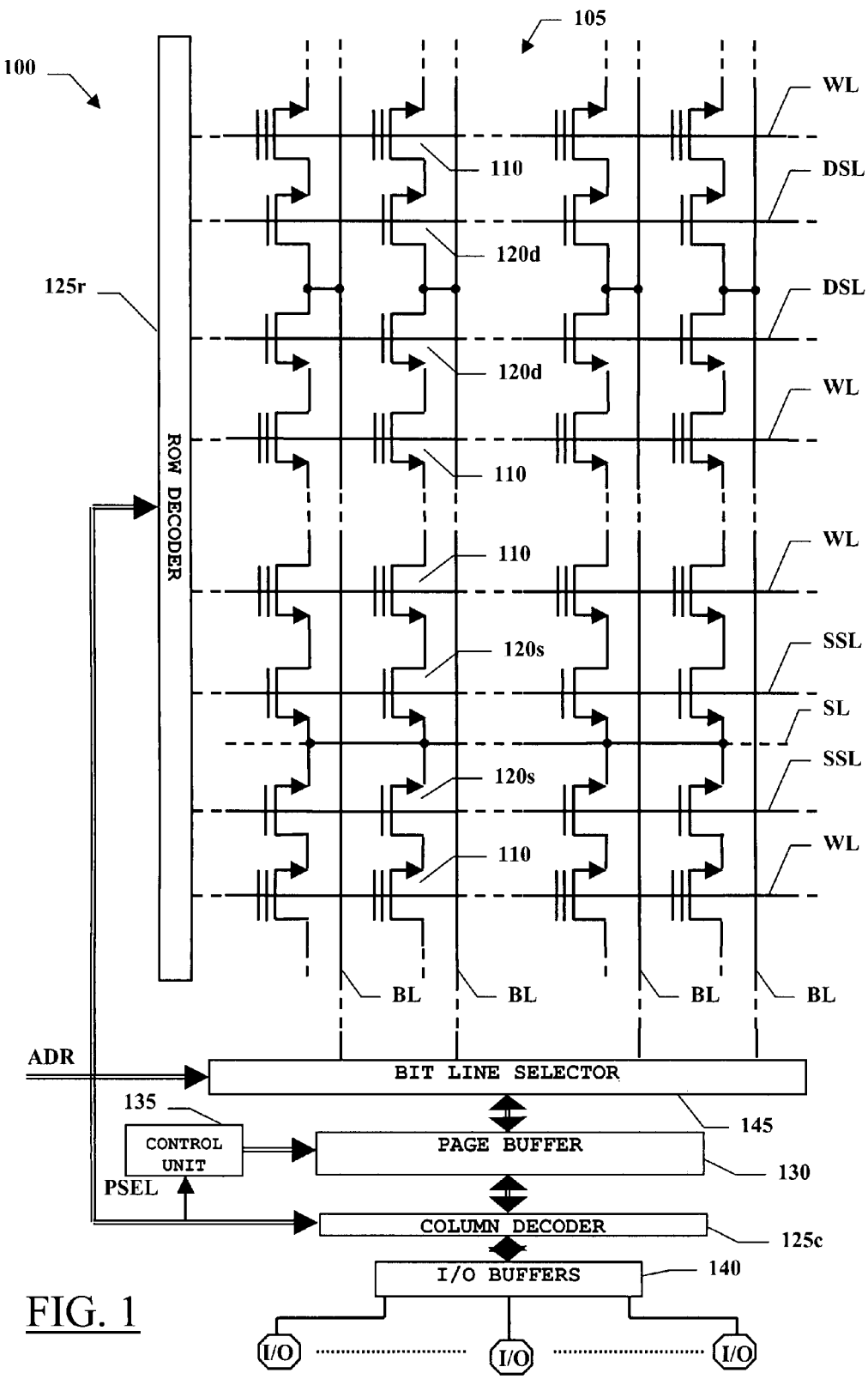
FIG. 1 is a circuital view of a non-volatile memory device, particularly of the NAND type.

With reference to the drawings, in FIG. 1 a non-volatile semiconductor memory, globally identified as 100, is schematically illustrated, particularly an electrically programmable, non-volatile semiconductor memory, for example a flash memory, according to an embodiment of the invention.

The flash memory 100 is integrated in a chip of semiconductor material, and includes a matrix 105 of memory cells 110 adapted to store data, arranged in a plurality of rows and a plurality of columns.

Typically, each memory cell 110 consists of an N-channel MOS transistor having a charge-storage element, such as a conductive floating gate adapted to be charged by electrons.

The flash memory 100 is a multi-level memory, particularly (for the sake of simplicity) a four-level memory, each cell being adapted to store a two-bit binary value, comprised of a Least Significant Bit (LSB) and a Most Significant Bit (MSB). Without entering into excessive details, well known to those skilled in the art, in an erased condition (first state, associated by convention with a logic value "11"), the memory cell 110 has a low threshold voltage value. The memory cell 110 may be programmed into any one of three further different states by causing amounts of electric charge to be put into the floating gate thereof. Each of these further three states is characterized by an increased threshold voltage value (corresponding to an increased amount of floating-gate electric charge) compared to that of the preceding state. More particularly, a second state (associated with a logic value "10"), is characterized by a threshold voltage value that is higher than that of the first state, and that is in turn lower than that of a third state (associated with a logic value "00"). A fourth state (associated with a logic value "01") is characterized by having the highest threshold voltage value. As will be made clearer in the following, when a memory cell 110 is selected for reading its content, the memory cell 110 will be conductive or not depending on its threshold voltage value and on the voltage value that is applied thereto during the reading.

The flash memory 100 has a so-called NAND architecture: in the matrix 105, groups of, e.g., eight, sixteen or even more (e.g., thirty-two) memory cells 110 are connected in series to each other to form a respective memory cells string, and different memory cells strings belonging to a same matrix column are connected in parallel to each other to a same bit line BL.

The memory cells 110 of a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110 in the string, and the source terminal connected to the drain terminal of another adjacent memory cell 110 in the string. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the memory cell 110 at the other end of the string has the source terminal connected to the drain terminal of the source select transistor 120s; the source terminal of the source select transistor 120s is connected to the source terminal of the corresponding source select transistor 120s of another adjacent memory cells string.

The control gate terminals of the memory cells 110 in each row are connected to a corresponding word line WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bit line BL. Conversely, the source terminals of all the source select transistors 120s in the matrix 105 are connected to a common source line SL (which in operation is typically kept at a reference voltage, or ground).

The memory cells 110 belonging to the same row are logically partitioned into different sets. Assuming, merely by way of example, that the matrix 105 includes 8192 bit lines BL, two sets of 4096 memory cells each for each word line WL are defined; assigning for example to each bit line BL an index corresponding to an integer in a progression that starts with the left-most bit line in the drawing, a first set consisting for example of the memory cells 110 in an even position (i.e., belonging to bit lines having an associated even index), and a second set consisting of the memory cells 110 in an odd position (i.e., belonging to bit lines having an associated odd index).

In the example considered herein, each word line WL corresponds to four different memory pages, each one corresponding to a specific group of bits. More particularly, a first memory page (also referred to as "first LSB page") includes the LSBs stored in the memory cells belonging to bit lines BL in even positions (i.e., the first set of memory cells); a second memory page (also referred to as "first MSB page") includes the MSBs stored in the memory cells belonging to bit lines BL in even positions. A third memory page (also referred to as "second LSB page") includes the LSBs stored in the memory cells belonging to the bit lines BL in odd positions (i.e., belonging to the second set of memory cells), while a fourth memory page (also referred to as "second MSB page") includes the MSB stored in the memory cells belonging to bit lines BL in odd positions. Consequently, the data stored in a generic memory cell 110 belongs both to an LSB page (first or second) and to an MSB page (first or second). The logic values assumed by the LSB and MSB correspond to the threshold voltage values of the memory cells 110; the adoption of the Gray coding allows reducing the number of read accesses necessary to retrieve the data stored in the four memory pages, as will be explained later.

Figure 2A:
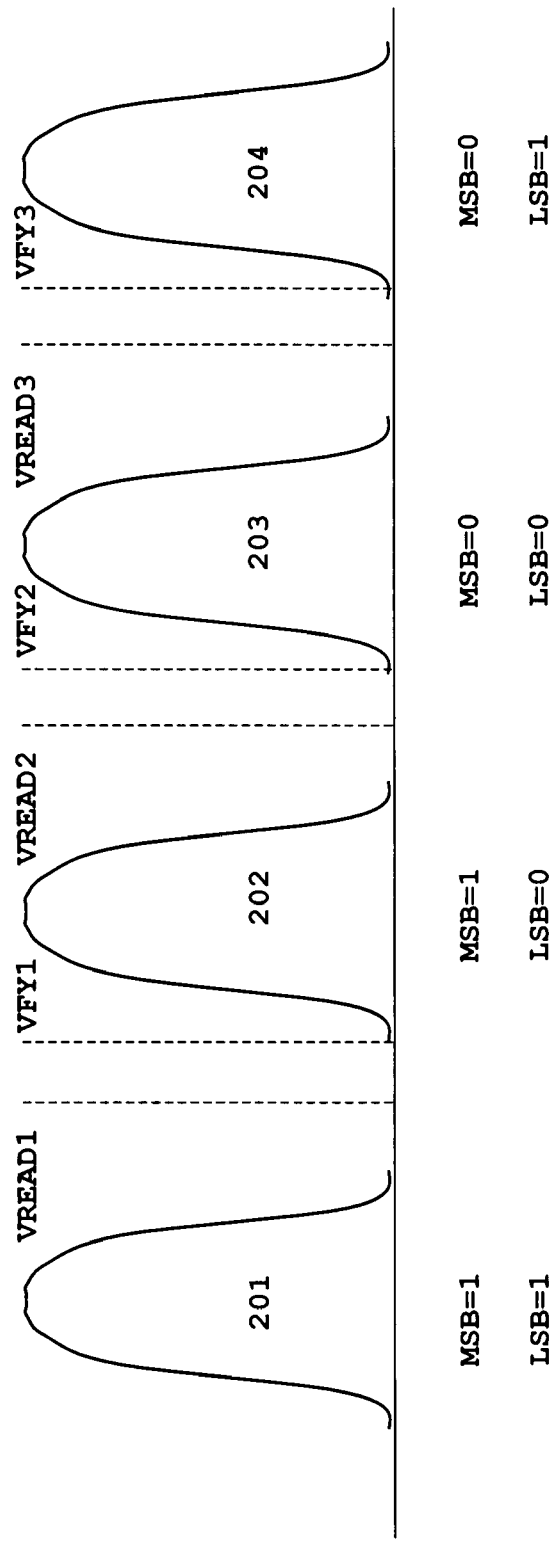
FIG. 2A is simplified view of threshold voltages statistical distributions of the memory cells of the memory device of FIG. 1.

Referring to FIG. 2A, a simplified view of threshold voltages statistical distributions 201, 202, 203, 204 of the memory cells 110 is illustrated. More particularly, the distribution 201 represents the distribution of the threshold voltage values of the memory cells in the erased condition, i.e., of the cells belonging to the first state, associated with the logic value "11" (MSB=1, LSB=1). The distribution 202 represents the distribution of the threshold voltage values of the memory cells in the second state, associated with the logic value "10" (MSB=1, LSB=0); the distribution 203 represents the distribution of the threshold voltage values of the memory cells in the third state, associated with the logic value "00" (MSB=0, LSB=0); and the distribution 204 represents the distribution of the threshold voltage values of the memory cells in the fourth state, associated with the logic value "01" (MSB=0, LSB=1). The four distributions are for example roughly Gaussian in shape, and are each one centered around a center threshold voltage value. Thanks to the Gray coding, states that are adjacent (in terms of the respective distribution of threshold voltage values) have corresponding logic values that differ from each other in only one bit.

Since each memory cell 110 is able to store 2 bits, each set of 4096 memory cells stores 1024 bytes. Consequently, each memory page is capable of storing 512 bytes. Thus, if, still by way of example, the matrix 105 includes 2048 word lines WL, the memory 100 has a total of 8192 memory pages of 512 bytes each. It is pointed out that the number of bit lines and word lines as well as the size of the memory page, may greatly vary, not being a limitation for the present invention. In particular, the number of memory pages that are associated with a generic word line may be higher, particularly multiples of two, such as eight and so on.

The flash memory 100 may further include a plurality of redundant bit lines (not shown), adapted to functionally substitute bit lines BL that, after the fabrication process of the flash memory, are possibly detected to be defective.

The flash memory 100 receives an address code ADR for selecting a desired memory page. A portion of the address code ADR is supplied to a row decoder 125r, which selects the desired word line WL, as well as the corresponding drain select line DSL and the corresponding source select line SSL. Another portion of the address code ADR is supplied to a column decoder 125c; the column decoder 125c connects I/O buffers 140, which are in turn associated with I/O terminals I/O of the flash memory 100, to a page buffer 130.

As will be described in greater detail in the following, the page buffer 130 is exploited as a temporary storage during read/program operations on the memory cells 110 of the selected page. The page buffer 130 has a storage capability at least equal to the storage capability of a memory page. For fitting an internal data parallelism of the flash memory 100 with a maximum external data parallelism, depending on a number p of the I/O terminals I/O (for example, eight or sixteen), the column decoder 125*c* provides to the page buffer 130 a data word to be written, or provides to the I/O terminals I/O a data word read, in chunks of p data bits at a time. Particularly, according to the decoding of the received portion of the address code ADR, the column decoder 125*c* connects desired portions of the page buffer 130 to the I/O terminals I/O.

The operation of the flash memory 100 is generally managed by a control unit, schematized as a block identified as 135, for example a microcontroller or a finite-state machine.

A memory page is selected by selecting a word line WL, and a packet of bit lines BL, as specified by the address code ADR; in the example herein considered, the packet of selected bit lines BL includes the 4096 bit lines in even position or the 4096 bit lines in odd position. The selection of the word line WL is directly performed by the row decoder 125*r*, while the selection of the packet of bit lines BL is performed by a bit line selector 145 between the matrix 105 and the page buffer 130. According to the decoding of a respective portion of the address code ADR, the bit line selector 145 selects the desired packet of bit lines and connects them to the page buffer 130.

During a read operation (page read), a data word stored in the selected memory page is read out and latched into the page buffer 130. The data word, temporarily stored in the page buffer 130, is then serially outputted through the I/O terminals I/O in chunks of, e.g., eight or sixteen bits by means of the column decoder 125*c*.

In greater detail, in order to access a memory cell 110 for reading the content thereof, the drain select transistor 120*d* and the source select transistor 120*s* in the memory cells string to which the cell belongs are turned on, by asserting the drain select line DSL and the source select line SSL (for example, these two lines are brought to a voltage equal to the supply voltage Vdd of the memory); the bit line BL to which the string of cells containing the memory cell to be read is connected is selected by the bit line selector 145. The row decoder 125*r* biases the word line WL to which the selected memory cell belongs to a specific reading voltage VREADX (X=1,2,3, as is explained in the following) adapted to discriminate the programming state of the memory cell; the remaining word lines WL controlling the gates of the other memory cells of the same string are all brought to a potential sufficiently high to ensure that these memory cells are turned on irrespective of their programming state (for example, a voltage of approximately 5.5 V). All the other word lines WL (associated with different memory cells strings) are for example kept grounded.

For reading the MSB of a memory cell 110, the row decoder 125*r* biases the word line WL to which the selected memory cell belongs to a reading voltage VREAD2, having a value that is intermediate between the center threshold voltages of the distribution 202 and the voltages of the distribution 203. If the threshold voltage of the selected memory cell 110 is lower than the reading voltage VREAD2, the selected memory cell 110 conducts, thus indicating that the MSB is equal to 1 (it has to be noted that it does not matter if the selected cell belongs to the distribution 201 or to the distribution 202, because both these distributions correspond to data values in which the stored MSB is equal to one). Contrarily, if the threshold voltage of the selected memory cell 110 is higher than the reading voltage VREAD2, the selected memory cell 110 does not conduct, thus indicating that the stored MSB is equal to 0. Thus, it can be appreciated that only one reading operation is necessary to retrieve the value of the MSB.

For reading the LSB, two reading operations are at most necessary. More specifically, a first reading operation is performed by biasing, by means of the row decoder 125*r*, the word line WL to which the selected memory cell belongs to a reading voltage VREAD1, having a value that is intermediate between the center threshold voltages of the distributions 201 and 202. If the threshold voltage of the selected memory cell 110 is lower than the reading voltage VREAD1, the selected memory cell 110 conducts, thus indicating that it belongs to the distribution 201 (first programming state), and that the LSB is equal to 1. In this case, just one read access is necessary for retrieving the stored LSB. Contrarily, if the threshold voltage of the selected memory cell 110 is higher than the reading voltage VREAD1, the selected memory cell 110 does not conduct, thus indicating that it does not belong to the distribution 201. In the latter case, a second reading operation needs to be performed, biasing the word line WL to which the selected memory cell belongs to a reading voltage VREAD3, having a value that is intermediate between the center threshold voltages of the distributions 203 and 204. If the threshold voltage of the selected memory cell 110 is lower than the reading voltage VREAD3, the selected memory cell 110 conducts, thus indicating that the LSB is equal to 0 (given that the first reading operation has indicated that the threshold voltage is higher than VREAD1). Conversely, if the threshold voltage of the selected memory cell 110 is higher than the reading voltage VREAD3, the selected memory cell 110 does not conduct, thus indicating that it belongs to the distribution 204, and that the LSB is equal to 1.

During a program operation (page program), a data word to be written, received from outside the memory through the I/O terminals I/O, is loaded into the page buffer 130. The data word to be written is received serially in, e.g., eight- or sixteen-bits chunks, and the page buffer 130 is thus replenished with data in a sequence of steps; when the buffer has eventually been filled, the data are written in parallel into the memory cells of a given selected page.

Memory cells 110 are programmed by Fowler-Nordheim tunneling of electrons into the floating gate. In order to access a given memory cell 110 for programming it, the drain select transistor 120*d* in the memory cells string to which the cell belongs is turned on by asserting the drain select line DSL (for example, bringing this line to the supply voltage Vdd), whereas the source select transistor 120*s* is kept off by keeping the source select line SSL deasserted (e.g., grounded); the bit line BL to which the string of cells containing the memory cell to be programmed is connected is selected by the bit line selector 145. The row decoder 125*r* biases the word line WL to which the selected memory cell belongs to a programming voltage VPROG, whose value and evolution in time is a function of the programming state that the memory cell 110 has to assume at the end of the program operation. As previously described, the fact that a memory cell 110 is in a particular state is determined by its threshold voltage value, that is in turn determined by the amount of charge present in the corresponding floating gate. Moreover, said amount of charge is generically proportional to the value and to the rate of increase of the programming voltage VPROG that is applied to the memory cell 110 (e.g., the higher the target threshold voltage value, the higher the value of the programming voltage VPROG to be applied). The remaining word lines WL controlling the gates of the other memory cells of the same string are all brought to a potential relatively high (e.g., approximately 10 V), for reasons that will be described later, but sufficiently lower than the programming voltage not to cause spurious programming. All the other word lines WL (associated with different memory cells strings) are for example kept grounded. In order to program the selected memory cell, the bit line BL is kept grounded, so that the drain select transistor 120d is surely kept on; the ground voltage at the bit line, propagating through the drain select transistor and the channel of the memory cells in the string, reaches the channel of the memory cell to be programmed; here, the voltage difference between the control gate (at the programming voltage VPROG) and the channel (close to the ground voltage) experienced by the selected memory cell is sufficient to cause electron tunneling into the floating gate. On the contrary, if the bit line is biased at a higher potential, for example equal to the memory supply voltage (Vdd, e.g. 3 V), as the drain select line DSL, the drain select transistor 120d turns off. Meanwhile, the voltage of the memory cells string rises. The channels of the memory cells of the selected memory cells string thus remain floating, and, thanks to the relatively high voltage (10 V) applied to the word lines WL to which the selected memory cell does not belong, the string channel voltage rises, due to the capacitive coupling, to a value such that the control gate-to-channel voltage difference at the selected memory cell is not sufficient to cause significant electron tunneling, and the memory cell is not programmed. In this way, by applying to the selected bit lines the proper voltage, the cells 110 of the selected page to be brought to the desired logic value are programmed, while the other cells 110 are left unchanged. In the same way as in the case of the read operation, for performing a program operation on both the LSB and the MSB, more steps are required. More specifically, assuming that each program operation is performed on erased memory cells 110 (i.e., in the first state), an LSB program operation is firstly performed: if the selected memory cell 110 has to be programmed in such a way to have an LSB value that is equal to 0, the programming voltage VPROG that biases the selected word line WL is such as to bring the threshold voltage of the selected memory cell to the distribution 202 (i.e., to the second state). Otherwise, the threshold voltage of the selected memory cell 110 remains in the first distribution (first state, or erased state). After performing the LSB program operation, the whole program operation is completed by programming the MSB value. More specifically, if the selected memory cell 110 has to be programmed in such a way to have an MSB value that is equal to 1, no further application of programming voltage VPROGR is needed. Consequently, the threshold voltage of the memory cell remains at the value it reached in the previous step (i.e., belonging to the distribution 201 if LSB is 1, and belonging to the distribution 202 if LSB is 0). On the contrary, if the selected memory cell 110 has to be programmed in such a way to have an MSB value that is equal to 0, the programming voltage VPROG is such as to bring the threshold voltage of the selected memory cell to the distribution 204 (i.e., to the fourth state) if the LSB is equal to 1 (i.e., if the threshold voltage before the MSB programming belonged to the distribution 201); conversely, if the LSB is equal to 0 (i.e., if the threshold voltage before the MSB programming belonged to the distribution 202), the programming voltage VPROG is such as to bring the threshold voltage of the selected memory cell to the distribution 203 (i.e., to the third state).

It has to be noted that, in a practical implementation, the previously described program operations are more complex. In fact, a program operation may include the repetition of a plurality of steps; at each step, the programming voltage VPROGR is slightly increased (up to a maximum value, e.g. 20V), and, after the application of the programming voltage, a verify operation is performed for assessing whether the target threshold voltage value has been reached. These features will be explained in great detail referring to the following description of the page buffer embodiment herein disclosed.

The erase operation has the purpose of bringing a block of memory cells 110 back to the erased state (logic value "11"), wherein by memory cells block there is intended a group of memory cells 110 corresponding to all the word lines WL of a string.

In order to erase a given block of memory cells 110, the semiconductor well including all the cells of the matrix 105 is biased to a relatively high erase voltage VERASE (e.g., 20 Volts) by means of an erase control circuit, not shown in the drawings, and all the bit lines BL of the matrix 105 are kept floating. Moreover, the row decoder 125r biases the word lines WL corresponding to the block to the ground voltage, while the remaining word lines WL of the matrix 105 are kept floating. The drain select lines DSL and the source select lines SSL of the block are kept floating (but they are precharged at about the supply voltage Vdd before the well is biased to the erase voltage VERASE), while the remaining are grounded. In this way, each memory cell 110 included in the selected block is biased in such a way to trigger the removal (by means of tunneling effect) of the electrical charge possibly stored in its floating gate. Also the erase operation may in the practice be more complex, including erase verify phases and soft program operations. Again, these additional features will be explained in great detail referring to the following description of the page buffer embodiment disclosed herein.

Figure 2B:
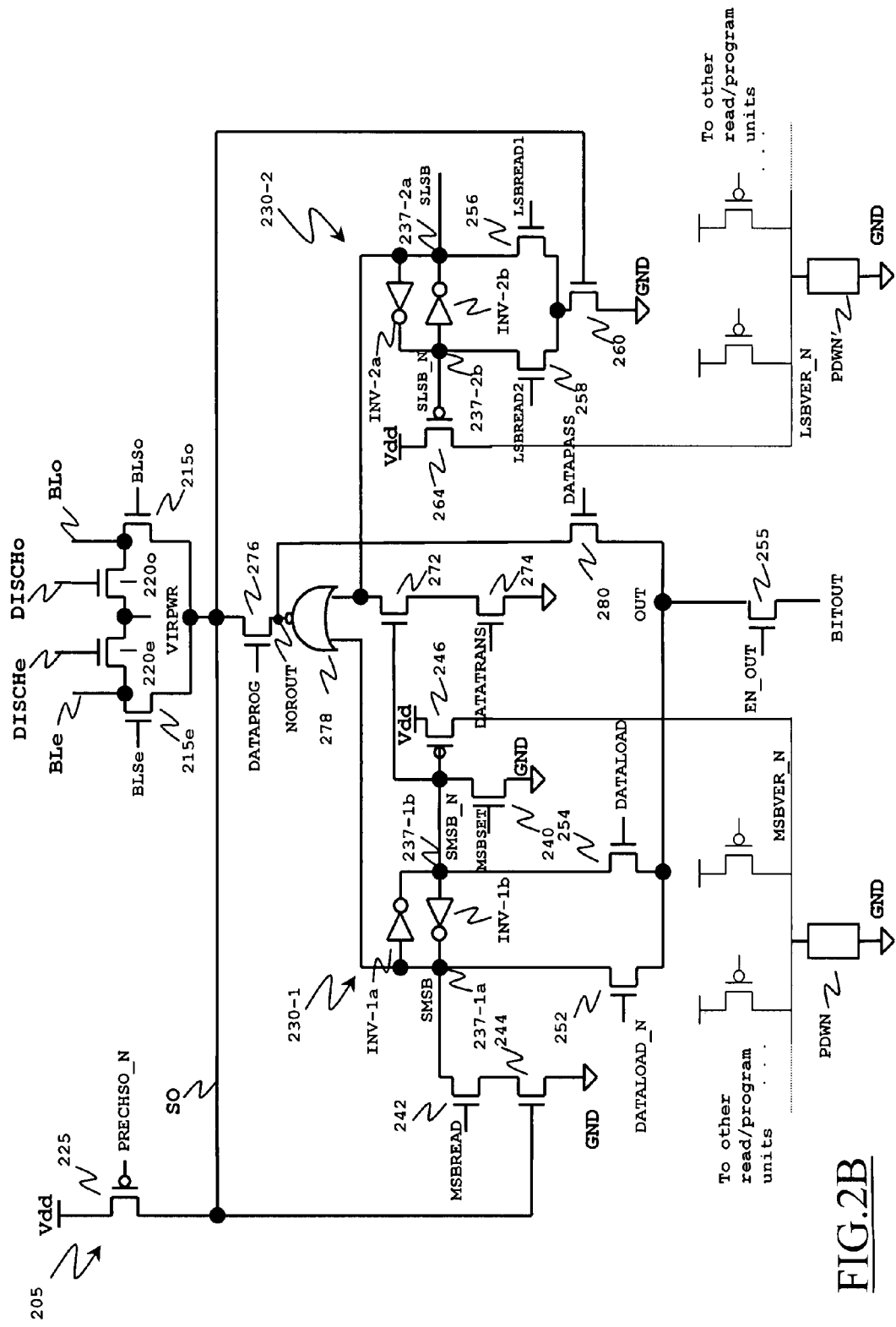
FIG. 2B illustrates the circuital view of a read/program unit included in the page buffer of the memory device, according to an embodiment of the present invention.

In FIG. 2B the circuit structure of a part of the page buffer 130 is shown, particularly a read/program unit thereof, according to an embodiment of the present invention.

Unless differently specified, the signals described in connection with the FIG. 2B are to be intended as logic signals, i.e., adapted to assume two voltage values, that is the supply voltage Vdd, and the ground voltage.

The page buffer includes a read/program unit 205 for each pair of adjacent bit lines (also each pair of the redundant bit lines is associated with a corresponding read/program unit 205). Particularly, an even bit line BLe and an odd bit line BLo are electrically couplable to a common node SO through respective N-channel MOS transistors 215e and 215o, included in the bit line selector 145. The transistors 215e and 215o have the respective drain terminal connected to the corresponding bit lines BLe, BLo, and the source terminals connected to the node SO; the gate terminals of the transistors 215e and 215o are controlled by respective select signals BLSe and BLSo, respectively. Two N-channel MOS transistors 220e and 220o are also provided, each one for precharging/discharging the respective bit line BLe and BLo to a biasing voltage VIRPWR (such a precharge/discharge operation is preferably performed before any program operation, as described in the following). To this purpose, the transistors 220e and 220o have the source terminals connected to the corresponding bit lines BLe, BLo; the drain terminals of the transistors 220e and 220o are connected together to a terminal for providing the biasing voltage VIRPWR. The gate terminals of the transistors 220e, 220o are controlled by respective precharge/discharge signals DISCHe, DISCHo.

A P-channel MOS transistor 225 is used for precharging the node SO during certain phases of the page buffer functioning, e.g., at the beginning of a read/program operation. For this purpose, the transistor 225 has the drain terminal connected to the node SO, the source terminal connected to a terminal providing the supply voltage Vdd, and the gate terminal controlled by a pre-charge signal PRECHSO_N.

The read/program unit 205 includes a first latch 230-1 and a second latch 230-2. The latch 230-1 is adapted to be employed for the reading of the MSB, for the programming of the MSB and for the loading of data from the outside of the page buffer during a writing operation. The latch 230-2 is instead adapted to be employed for the reading of the LSB, for the programming of the LSB and the MSB and for the erase operation.

The latch 230-1 is formed by two inverters INV-1a and INV-1b, connected in a loop with the input terminal of the inverter INV-1a connected to the output terminal of the inverter INV-1b so as to define a node 237-1a, providing a signal SMSB, and the output terminal of the inverter INV-1a connected to the input terminal of the inverter INV-1b so as to define a node 237-1b, providing a signal SMSB_N that is the logic Complement of the signal SMSB.

An N-channel MOS transistor 240 is used to set the latch 230-1; by "set the latch" there is meant bringing the signal SMSB to the supply voltage VDD. For this purpose, the transistor 240 has the drain terminal connected to the node 237-1b, the source terminal connected to ground and the gate terminal controlled by an MSB latch reset signal MSBSET. The latch 230-1 is reset (i.e., the signal SMSB is brought to the ground voltage) by means of two N-channel MOS transistors 242 and 244 that are connected in series: the transistor 242 has the drain terminal connected to the node 237-1a and the source terminal connected to the drain terminal of the transistor 244; the source terminal of the transistor 244 is connected to ground. The gate terminal of the transistor 244 is controlled by the voltage at the node SO, whereas the gate terminal of the transistor 242 is controlled by an MSB latching or read signal MSBREAD.

A P-channel MOS transistor 246 is used during a program verify phase for assessing if an MSB program operation has been accomplished in the correct way. For this purpose, the transistor 246 has the source terminal connected to a terminal providing the supply voltage Vdd, a gate terminal connected to the node 237-1b, and the drain terminal connected (node MSBVER_N) to a first terminal of a highly-resistive pull down circuit PDWN, the latter having a second terminal connected to ground. Said pull down circuit PDWN is placed outside the single read/program unit 205, and its first terminal is commonly connected to transistors 246 in all the other read/write units included in the page buffer 130, in the same way as for the read/write unit herein described.

N-channel MOS transistors 252 and 254 are used to load data to be written into the first latch 230-1 at the beginning of a program operation. For this purpose, the transistors 252 and 254 have respective drain terminals connected to the nodes 237-1a and 237-1b. The source terminals of the transistors 252 and 254 are connected together to a node OUT; the node OUT is in turn coupled to the column decoder 125c by means of an N-channel MOS transistor 255. The gate terminal of the transistor 252 receives a data load signal DATALOAD_N (whose logic state determines the target value to be loaded into the first latch 230-1) and the gate terminal of the transistor 254 receives a further data load signal DATALOAD (which is the logic complement of the data load signal DATALOAD_N). The transistor 255 has a drain terminal connected to the node OUT, a gate terminal receiving an output enabling signal EN_OUT and a source terminal connected to an I/O data line BITOUT in turn connected to the column decoder 125c.

The latch 230-2 is formed by two inverters INV-2a and INV-2b, connected in a loop with the input terminal of the inverter INV-2a connected to the output terminal of the inverter INV-2b so as to define a node 237-2a, providing a signal SLSB, and the output terminal of the inverter INV-2a connected to the input terminal of the inverter INV-2b so as to define a node 237-2b, providing a signal SLSB_N that is the logic complement of the signal SLSB.

Three N-channel MOS transistors 256, 258 and 260 are used to set/reset the latch 230-2 and to read/verify the LSB. For this purposes, the transistor 256 has the drain terminal connected to the node 237-2a, the source terminal connected to the drain terminal of the transistor 260, and the gate terminal controlled by a first LSB latching or read signal LSBREAD1. The transistor 258 has the drain terminal connected to the node 237-2b, the source terminal connected to the drain terminal of the transistor 260, and the gate terminal controlled by a second LSB latching or read signal LSBREAD2. Moreover, the transistor 260 has the source terminal connected to a terminal providing the ground voltage, and the gate terminal connected to the node SO.

A P-channel MOS transistor 264 is used during verify phases for assessing if an erase operation, or an LSB or an MSB program operation has been accomplished in the correct way. For this purpose, the transistor 264 has the source terminal connected to a terminal providing the supply voltage Vdd, a gate terminal connected to the node 237-2b, and the drain terminal connected (node LSBVER_N) to a first terminal of a further highly-resistive pull down circuit PDWN', having the same features of the highly-resistive pull down circuit PDWN, and connected to all the read/write units included in the page buffer 130.

Two series connected N-channel MOS transistors 272, 274 are used to allow the data transfer from the latch 230-1 to the latch 230-2. More particularly, the transistor 272 has the drain terminal connected to the node 237-2a, the gate terminal connected to the node 237-1b and the source terminal connected to the drain terminal of the transistor 274. The transistor 274 has the gate terminal controlled by a data transfer signal DATATRANS and a source terminal connected to ground.

The read/program unit 205 further includes a circuit structure including an N-channel MOS transistor 276 and a two-inputs NOR gate 278 adapted to be used during an LSB or an MSB program operation. The transistor 276 has a drain terminal connected to the node SO, a source terminal connected to the output terminal of the NOR gate 278 (node NOROUT) and a gate terminal receiving a program data signal DATAPROG. The NOR gate 278 has a first input terminal connected to the node 237-1a and a second input terminal connected to the node 237-2a.

An N-channel MOS transistor 280 is provided for transferring data to the output of the page buffer 130. The transistor 280 has a drain terminal connected to the node NOROUT, a gate terminal receiving a signal DATAPASS and a source terminal connected to the node OUT.

In the following all the possible operations executed by the page buffer 130 will be described (i.e., for executing read, program, and erase operations). For the sake of brevity, reference will be made only to the cases in which the selected memory cells 110 that are to be read, programmed and erased are connected to the even bit lines BLe (i.e., corresponding to an even page), the case of odd bit lines BLo being the same. More specifically, the following description will refer in particular to a single read/program unit 205. Consequently, although reference will be made also to whole memory pages, the description will deal in great detail only with a single memory cell 110 thereof, and with its corresponding string.

Read Operations

LSB Read Operation

As previously stated, thanks to the adoption of the Gray coding and to the fact that the data stored in each memory cell belong to two memory pages (both to an LSB page and to an MSB page), an LSB read operation requires performing at most two read accesses, one exploiting the reading voltage VREAD1, and one exploiting the reading voltage VREAD3. Firstly, the latch 230-2 is set and the latch 230-1 is reset. To this purpose, the node SO is driven to the supply voltage Vdd by means of the transistor 225, which is activated by driving the signal PRECHSO_N to the ground voltage. At the same time, the signal LSBREAD2 and the signal MSBRREAD are driven to the supply voltage Vdd. In this way, the transistors 258 and 260 turn on, forcing the node 237-2b to the ground voltage. Thus, the signal SLSB_N assumes the ground voltage value, and the signal SLSB is driven by the latch 230-2 to the supply voltage Vdd. Moreover, also the transistors 242 and 244 turn on, so the node 237-1a is forced to the ground voltage. In this way the signal SMSB assumes the ground voltage.

The next step consists of precharging the selected (even, in the considered example) bit lines BLe at a predetermined voltage value. For this purpose, the transistor 225 remains on, while the select signal BLSe (that is provided to the gate terminal of the transistor 215e) is driven to a predetermined voltage V1.

Consequently, the (parasitic capacitance associated with) the bit line BLe charges and reaches a voltage equal to V1 minus a threshold voltage VTHN of the transistor 215e, while the node SO remains at the supply voltage. In the meantime, the word line WL corresponding to the selected page of memory cells 110 is driven by the row decoder 125r to the reading voltage VREAD1, the remaining word lines WL controlling the gates of the other memory cells of the selected string are all brought to a potential sufficiently high (e.g., 5.5 V) to ensure that these memory cells are turned on irrespective of their programming state, and the selected drain select line DSL is driven to the supply voltage Vdd. At this time, the transistor 225 turns off (the signal PRECHSO_N is driven back to the supply voltage Vdd), the select signal BLSe is driven to the ground voltage, and the source select line SSL corresponding to the selected string is driven to the ground voltage too.

In this way, the selected string is capable to conduct a current or not depending on the state of the selected memory cell 110. Since the selected bit line BLe was charged to (and then left floating at) a voltage equal to V1−VTHN, the bit line begins to discharge if the threshold voltage of the selected memory cell is lower than the reading voltage VREAD1 (i.e., if the selected memory cell 110 is conductive), otherwise the bit line remains at the voltage V1−VTHN. Meanwhile, the node SO remains charged at the supply voltage Vdd. Subsequently, the select signal BLSe is driven to a further predetermined voltage V2, whose value is lower than that of the predetermined voltage V1. If the voltage of the selected bit line BLe has reached a value that is lower than V2−VTHN, the transistor 215e turns on, thus forcing the voltage of the node SO to assume a voltage value equal to that of the selected bit line BLe (i.e., close to the ground voltage), otherwise the transistor 215e remains turned off, and the node SO remains at a voltage equal to the supply voltage Vdd. At this time, the signal LSBREAD1 is driven to the supply voltage Vdd. If the node SO is still at the supply voltage Vdd (turning the transistor 260 on), the node 237-2a is brought to the ground voltage (the transistor 256 is turned on too), and thus the signal SLSB is brought to ground voltage. In this way, the latch 230-2 switches, and thus the signal SLSB_N is driven to the supply voltage Vdd. This means that the LSB in the selected cell is equal to 0.

Contrarily, if the node SO has been discharged, the transistors 256, 260 and the latch 230-2 are properly sized in such a way that the latch 230-2 does not switch (SLSB_N=0, SLSB=Vdd, according to the initial latch setting). This implies that the LSB in the selected cell is equal to 1. This latter situation is encountered if the threshold voltage of the selected memory cell 110 belongs to the distribution 201, and thus the selected string drains current and discharges the node SO.

The second read phase (the one exploiting the reading voltage VREAD3) proceeds in a way similar to the one previously described. The only differences consist in the fact that this time the word line WL corresponding to the selected page of memory cells 110 is driven by the row decoder 125r to the reading voltage VREAD3, and it is the transistor 258, driven by the signal LSBREAD2, rather than the transistor 256, that is used for causing the latch 230-2 to switch. In this way, if the node SO remains at the supply voltage Vdd (which occurs only when the selected memory cell 110 has the threshold voltage belonging to the distribution 204, and thus it does not drain current), the signal SLSB_N at the node 237-2b is brought to the ground voltage. This means that the LSB in the selected cell is equal to 1. If instead the node SO is discharged, the LSB value is the same as the one given by the previous read phase (that is, the one exploiting the reading voltage VREAD1): more specifically, LSB=1 if the threshold voltage of the selected memory cell belongs to the distribution 201, and LSB=0 if the threshold voltage belongs to the distribution 202 or 203.

After these two read phases, the correct LSB value is stored in the latch 230-2. More particularly, if the signal SLSB is equal to the supply voltage Vdd (SLSB_N equal to the ground voltage), the stored LSB is equal to 1, and if the signal SLSB is equal to the ground voltage (SLSB_N equal to the supply voltage Vdd), the stored LSB is equal to 0.

The retrieved LSB value can be provided to the outside of the page buffer 130 (i.e., to the column decoder 125c and to the I/O buffers 140) using the logic complement of the value of the signal SLSB. More particularly, since at the beginning of the LSB read operation the node 237-1a has been reset, the NOR gate 278 behaves as an inverter having an input terminal corresponding to the node 237-2a and an output terminal corresponding to the node NOROUT (it should be noted that the latch 230-1 has for this reason been reset). In this way, the logic complement of the signal SLSB is provided to the I/O data line activating the transistors 280 and 255 by asserting to the supply voltage Vdd the signals DATAPASS and EN_OUT, respectively.

Figure 2C:
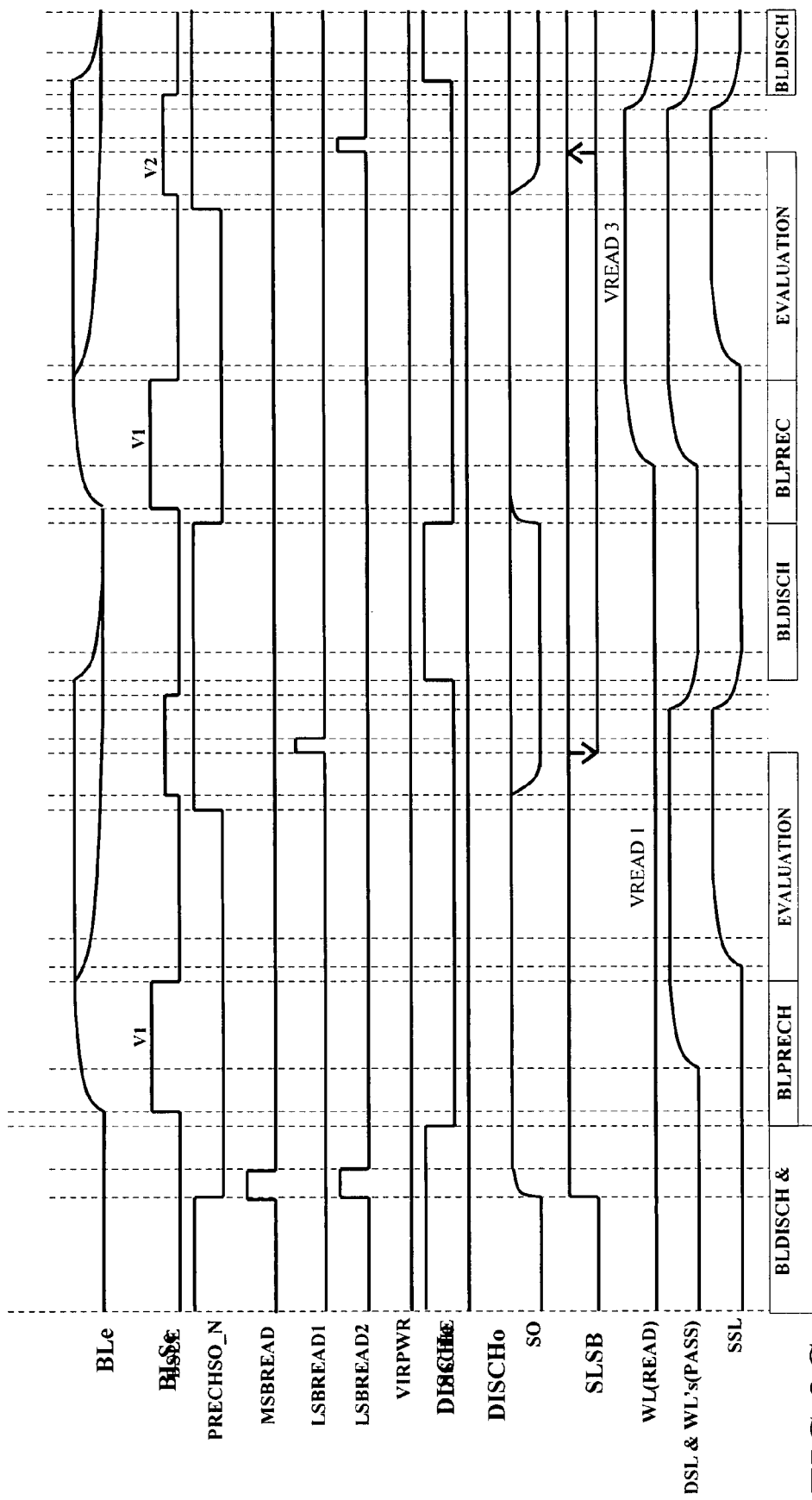
FIG. 2C illustrates a time diagram corresponding to an LSB read operation.

Referring now to FIG. 2C, a time diagram showing the timing of a plurality of signals that are involved in the memory device during an LSB read operation is illustrated.

It has to be noted that, for performing the LSB read operation, one or at most two reading accesses are necessary. This is possible thanks to the choice of using the Gray coding for associating the logic values to the corresponding states, and thanks to the fact that the data stored into each single memory cell belongs to two memory pages.

MSB Read Operation

A first step of the MSB read operation consists in properly setting the latch 230-1 and resetting the latch 230-2. For this purpose the signal MSBSET is driven to the supply voltage Vdd, thus activating the transistor 240. In this way, the signal SMSB_N at the node 237-1b is driven to the ground voltage. Consequently, the signal SMSB at the node 237-1a is driven by the latch 230-2 to the supply voltage Vdd. Moreover, the node SO is driven to the supply voltage Vdd by means of the transistor 225 and the signal LSBREAD1 is driven to the supply voltage Vdd too, so that the transistors 256 and 260 are turned on, and the node 237-2a is forced to the ground voltage. In this way the signal SLSB assumes the ground voltage.

The MSB read operation is similar to the LSB read operation. Briefly, the selected (even) bit line BLe is charged to the voltage V1–VTHN, in the same way as in the LSB read operation case.

Subsequently, the signal MSBREAD is asserted to the supply voltage, while the bit line select signal BLSe is driven to the voltage V2. Moreover, the word line WL corresponding to the selected page of memory cells 110 is driven by the row decoder 125r to the reading voltage VREAD2, the remaining word lines WL controlling the gates of the other memory cells of the selected string are all brought to a potential sufficiently high to ensure that these memory cells are turned on irrespective of their programming state, and the selected drain select line DSL is driven to the supply voltage Vdd. In this way, if the threshold voltage of the selected memory cell 110 is higher than the reading voltage VREAD2, the node SO remains at the supply voltage Vdd, and the transistor 244 turns on. In this case, the node 237-1a discharges, and the corresponding signal SMSB is brought to the ground voltage, which means that the stored MSB is equal to 0.

On the contrary, if the node SO discharges, the transistor 244 does not turn on, and the signal SMSB remains at the supply voltage Vdd, thus meaning that the stored MSB is equal to 1. The MSB value can be provided to the outside of the page buffer 130 (i.e., to the column decoder 125c and to the I/O buffers 140) using the logic complement of the value of the signal SMSB. More particularly, since at the beginning of the MSB read operation the node 237-2a has been reset, the NOR gate 278 behaves as an inverter having an input terminal corresponding to the node 237-1a and an output terminal corresponding to the node NOROUT (it should be noted that the latch 230-2 has for this reason been reset). In this way, the logic complement of the signal SMSB is provided to the I/O data line activating the transistors 280 and 255 by asserting to the supply voltage Vdd the signals DATAPASS and EN_OUT, respectively.

Figure 2D:
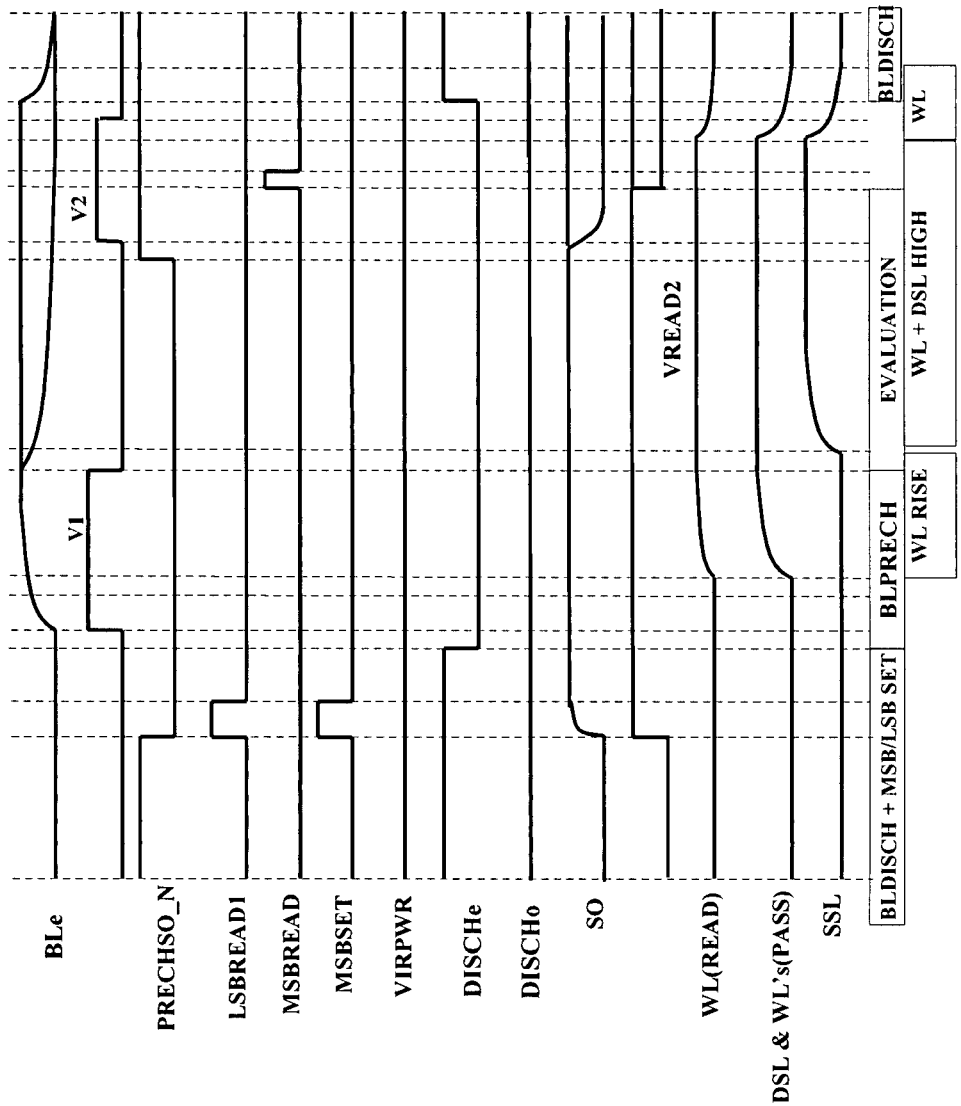
FIG. 2D illustrates a time diagram corresponding to an MSB read operation

In FIG. 2D, a time diagram showing the timing of a plurality of signals that are involved in the memory device during an MSB read operation is illustrated.

Program Operations

Referring now to the procedures carried out by the page buffer 130 for performing an MSB and an LSB program operation, it is to be emphasized that the memory cells 110 belonging to a same word line WL are programmed in parallel, and receive a same programming pulse at their gate terminal. The main task of the page buffer 130 during this phase is to determine which memory cells 110 belonging to said word line WL are to be programmed and which not. For this purpose, each read/program unit 205 properly biases the corresponding bit line, in such a way that if the latter is kept at the ground voltage, the corresponding memory cell 110 is programmed, otherwise, if the bit line is kept at the supply voltage Vdd (more generally, at a program inhibit voltage), the corresponding memory cell 110 is not programmed, despite it receiving the programming pulse on its control gate. It is assumed that the memory cells 110 that are to be programmed have their threshold voltages that belong to the distribution 201, i.e., they are erased memory cells (for example, before being applied programming pulses, they are all erased).

LSB Program Operation

The first step for programming the LSB into a memory cell is to load the target LSB value that has to be programmed into the read/program unit 205, using the latch 230-1 (data load procedure). For this purpose, the node 237-1a is firstly brought to the ground voltage (reset operation): this is accomplished by precharging the node SO to the supply voltage Vdd by means of the transistor 225 (activated by the signal PRECHSO_N), and then asserting the signal MSBREAD to the supply voltage. In this way, both the transistors 242 and 244 turn on, and the signal SMSB at the node 237-1a assumes the ground voltage. It is observed that the reset operation puts the latch in a condition such that the corresponding memory cell will not be programmed. This is necessary for the read/program units associated with defective bit lines that have been functionally replaced by spare ("redundant") ones, because a read/program unit that is connected to a defective bit line does not perform a data load procedure. Moreover, this reset operation is necessary in the case the page buffer 130 performs a partial data load procedure, i.e., when only a part of the read/program units 205 of the page buffer receives the corresponding target LSB value that has to be programmed. In this way, the read/program units 205 that do not have to perform a data load procedure act as if they should receive during the data load procedure the information of not executing any program operation on the respective memory cells.

Having reset the signal SMSB, the next step consists in setting the signal SLSB at the node 237-2a. For this purpose, the signal SLSB_N at the node 237-2b (the logic complement of the signal SLSB) is brought to the ground voltage: this is accomplished by asserting the signal LSBREAD2 to the supply voltage. In this way, both the transistors 258 and 260 turn on (the node SO is still at the supply voltage Vdd), and the signal SLSB_N at the node 237-2b assumes the ground voltage.

Subsequently, the data load procedure is executed. For this purpose, the I/O data line BITOUT is driven to the ground voltage, and the signal EN_OUT is driven to the supply voltage Vdd. In this way, the node OUT is driven to the ground voltage too. Moreover, the transistors 252 and 254 are activated in a mutually exclusive way by means of the signals DATALOAD and DATALOAD_N, in such a way to force the signal SMSB or respectively the signal SMSB_N to the ground voltage. More particularly, if the target LSB value is 0, the program operation has to be enabled, forcing the signal SMSB_N to the ground voltage by asserting the signal DATALOAD to the supply voltage Vdd. On the contrary, if the target LSB value is 1, the program operation has to be inhibited, forcing the signal SMSB to the ground voltage by asserting the signal DATALOAD_N to the supply voltage Vdd.

The next operation consists in transferring the data stored in the latch 230-1 to the latch 230-2; this operation is referred to as data transfer. For this purpose, the transistor 274 is activated by driving the signal DATATRANS to the supply voltage Vdd. In this way, if the signal SMSB_N at the node 237-1b has a voltage equal to the ground voltage, the signal SLSB at the node 237-2a remains at the supply voltage Vdd; otherwise, if the signal SMSB_N is at the supply voltage Vdd, the transistor 272 is turned on, forcing the signal SLSB at the node 237-2a to the ground voltage. Thus, at the end of the data transfer operation, the signal SLSB has a voltage equal to that of the signal SMSB.

At the end of the data transfer operation, the latch 230-1 is reset, so as to bring the node 237-1a to the ground voltage. For this purpose, the node SO is brought to the supply voltage Vdd (by means of the transistor 225) and the signal MSBREAD is driven to the supply voltage Vdd, too. In this way, the signal SMSB at the node 237-1a being at the ground voltage, the NOR gate 278 behaves as an inverter having an input terminal corresponding to the node 237-2a and an output terminal corresponding to the node NOROUT.

After this phase, the program operation is started. For this purpose, both the even bit line BLe and the odd bit line BLo are precharged to the supply voltage Vdd by asserting the signal VIRPWR to the supply voltage Vdd and by activating the transistors 220e and 220o by means of the signals DISCHe and DISCHo, respectively. These latter signals have voltage values that are higher than that of the supply voltage Vdd by at least a transistor threshold voltage. Before applying the programming voltage VPROG to the selected word line WL, the transistor 276 is turned on by asserting the signal DATAPROG to the supply voltage Vdd, and the select signal BLSe provided to the gate of the transistor 215e is driven to the supply voltage Vdd. If the signal SLSB is at the supply voltage Vdd (first case), the node NOROUT is brought to the ground voltage and the selected (even) bit line BLe discharges. Otherwise, if the signal SLSB is at the ground voltage (second case), the selected bit line BLe remains at the supply voltage Vdd. By applying the programming voltage VPROG to the selected word line WL, the selected memory cell 110 will be programmed in the first case, otherwise, in the second case, the selected memory cell 110 will not be programmed.

As previously mentioned, the program operation includes the repetition of a plurality of steps, each step including the application to the selected word line of a pulse of programming voltage VPROGR, which value increases at each step (up to a maximum value), and then the execution of a verify phase for assessing if the target threshold voltage value has been reached. Thus, the programming of the threshold voltage of the selected memory cell occurs by means of small increments thereof (e.g., of 100 mV per step). The specific number of the steps that are necessary to increment the threshold voltage of the selected memory cell until it reaches the desired distribution is not known a priori, because each memory cell responds to the application of a same programming voltage pulse in a different way (because of the unavoidable mismatches among different cells given by the tolerances of the process parameters). Furthermore, memory cells belonging to the same word line WL typically need different numbers of steps for reaching the corresponding desired distributions (that can be different from cell to cell).

Consequently, after each of said programming steps, a verify phase is needed: if said verify on a particular memory cell 110 gives a positive result, the read/program unit 205 corresponding thereto has to inhibit any further programming step on its corresponding memory cell, while the other memory cells corresponding to read/program units 205 in which the verify has provided a negative result, are still subjected to further programming steps. The verify phase corresponding to each one of the threshold distributions 202, 203, 204 is a reading operation that makes use of reading voltages that are slightly higher than the corresponding reading voltage VREADX (X=1,2,3). In the case of an LSB program verify read, a verify reading voltage VFY1 is used that has a value slightly higher than the value VREAD1. In this case, if the verify gives a positive result (i.e., the threshold voltage of the selected memory cell 110 has reached the distribution 202), the read/write unit 205 has to force the voltage of the selected bit line to the supply voltage Vdd, in such a way to inhibit any further programming on the corresponding memory cell 110.

The verify operation starts with the precharging of the bit lines to a voltage equal to V1−VTHN (this is accomplished in the same way as in the previously described read operations), then proceeds with a read operation exploiting the verify reading voltage VFY1 on the selected word line WL, and activating the transistor 256 by asserting the signal LSBREAD1 to the supply voltage. It has to be noted that the verify phase is not preceded by any latch setting, differently from the case of normal read operations.

If it is assessed that the selected memory cell 110 is programmed to the target programming state (i.e., its threshold voltage has reached the distribution 202), the node SO remains at the supply voltage Vdd and the signal SLSB_N at the node 237-2b is brought to the supply voltage Vdd: thus, in the following programming step (that provides again for precharging the node SO and the selected even bit line BLe to the supply voltage Vdd), the selected even bit line BLe remains at the supply voltage Vdd and thus the corresponding memory cell 110 will be not programmed. On the contrary, if it is assessed that the selected memory cell 110 has not yet reached the target programming state (its threshold voltage has not reached the distribution 202), the signal SLSB_N will remain to the ground voltage, and in the following programming step, the selected even bit line BLe will be discharged again, and thus the selected memory cell 110 will be subjected to a further programming step.

The loop comprising the repetition of program operations and verify phases ends when the nodes 237-2b (corresponding to the signals SLSB_N) of all the read/program units 205 of the page buffer 130 assume voltage values equal to the supply voltage Vdd: at this point, all the transistors 264 will be turned off, and the voltage value of the node LSBVER_N (that is common to all the read/program units 205 of the page buffer) will be brought to the ground voltage by means of the highly-resistive pull down circuit PDWN.

Figure 2E:
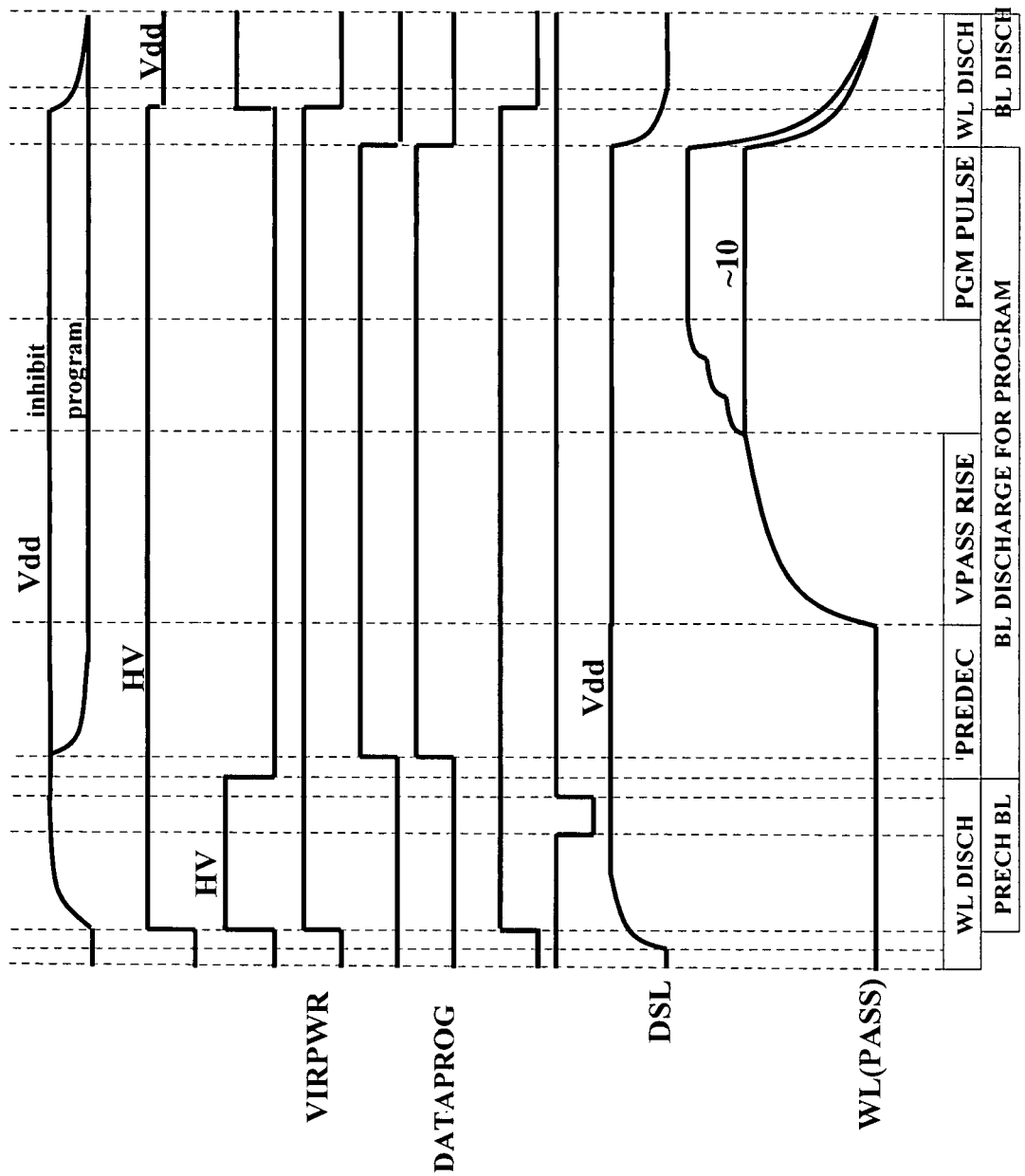
FIG. 2E illustrates a time diagram corresponding to an LSB program operation.
Figure 2F:
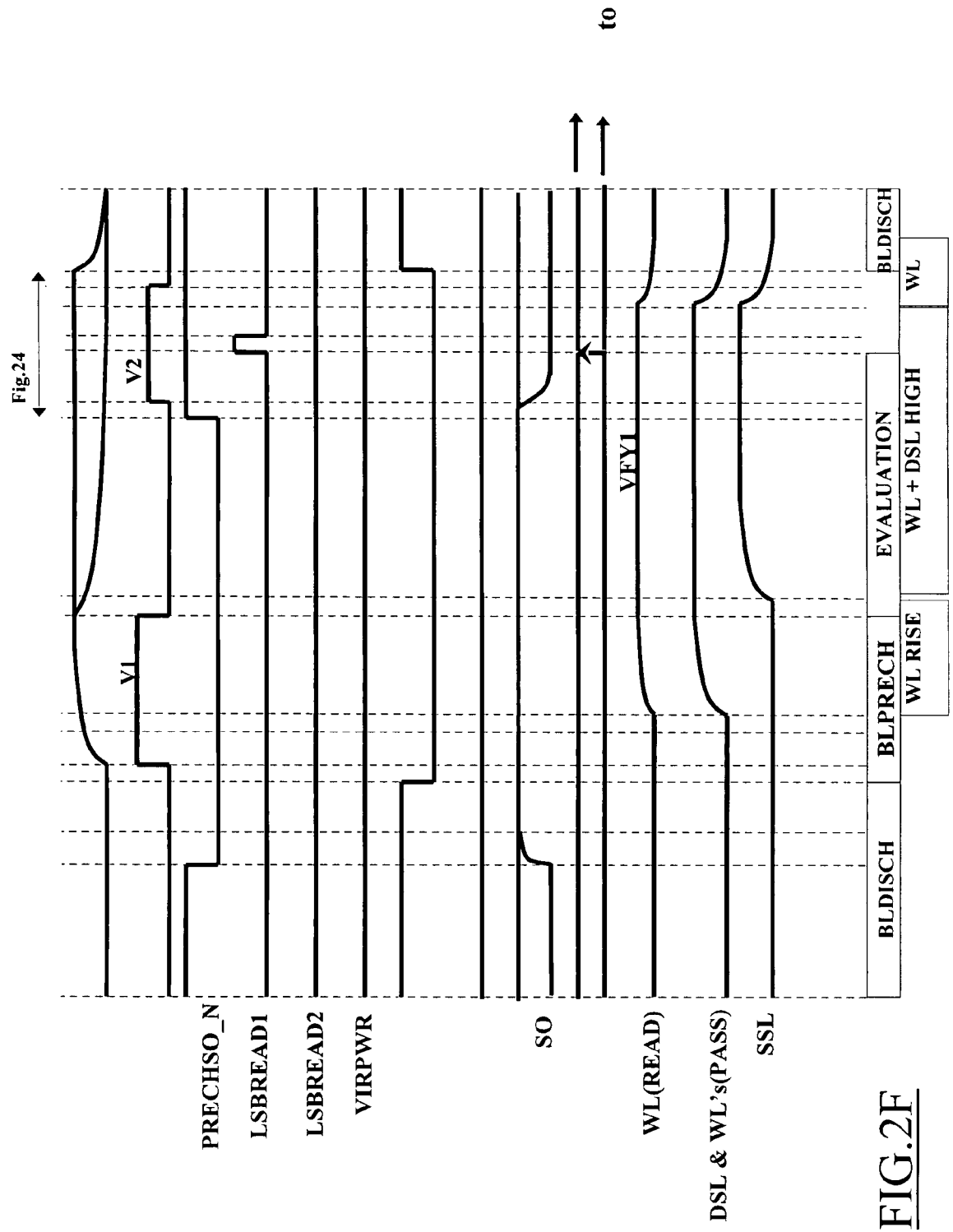
FIG. 2F illustrates a time diagram corresponding to an LSB verify.

In FIGS. 2E and 2F, two time diagrams showing the timing of a plurality of signals that are involved in the memory device during an LSB program operation and an LSB verify operation are respectively illustrated.

MSB Program Operation

The first step for programming the MSB consists of loading into the read/program unit 205 the target MSB value that has to be programmed, using the latch 230-1 (data load procedure). For this purpose, the node 237-1a is firstly brought to the ground voltage (reset operation): this is accomplished by precharging the node SO to the supply voltage Vdd by means of the transistor 225 (activated by the signal PRECHSO_N), and then asserting the signal MSBREAD to the supply voltage. In this way, both the transistors 242 and 244 turn on, and the signal SMSB at the node 237-1a assumes the ground voltage. Subsequently, a data load procedure for storing into the latch 230-1 the information that indicates which is the target MSB value is performed, in an identical way as for the LSB program operation. More particularly, if the signal SMSB_N is driven to the supply voltage Vdd, it means that no further program operations are needed to reach the target programming state (MSB=1); otherwise, if the signal SMSB_N is driven to the ground voltage, it means that an MSB program operation has to be performed to reach the target programming state (MSB=0).

Then, an LSB read operation is performed, for getting knowledge of in which distribution the threshold voltage of the selected memory cell has to be programmed. For this purpose, the node 237-2b is firstly brought to the ground voltage by asserting the signal LSBREAD2 to the supply voltage Vdd. In this way, the signal SLSB_N assumes a voltage equal to the ground voltage, and consequently, the signal SLSB at the node 237-2a assumes a voltage equal to the supply voltage Vdd. The LSB read operation is then performed, as previously described, exploiting the reading voltage VREAD1.

It has to be noted that, as already mentioned in the foregoing, if the target MSB value is 1, the threshold voltage of the selected cell has to remain in the distribution wherein it already is (i.e., in the distribution 201 if LSB=1 and in the distribution 202 if LSB=0). Vice versa, if the target MSB value is 0, a memory cell whose threshold voltage belongs to the distribution 201 has to be brought to the distribution 204, while a memory cell whose threshold voltage belongs to the distribution 202 has to be brought to the distribution 203.

The next operation consists in combining the information stored in the latch 230-1 and the latch 230-2, by activating the transistor 274. In this way at the end of the data transfer operation, if the signal SMSB_N is equal to the supply voltage, the signal SLSB will assume the ground voltage. Contrarily, if the signal SMSB_N is equal to the ground voltage, the signal SLSB will maintain its previous voltage value.

At this point, the situation of the nodes 237-1a and 237-2a becomes one of the following:

case 1: if the LSB is such that the threshold voltage of the selected memory cell belongs to the distribution 201 (LSB=1), and if the target MSB value is 1, both the signals SMSB and SLSB will be at the ground voltage;

case 2: if the LSB is such that the threshold voltage of the selected memory cell belongs to the distribution 202 (LSB=0), and if the target MSB value is 1, both the signals SMSB and SLSB will be at the ground voltage;

case 3: if the LSB is such that the threshold voltage of the selected memory cell belongs to the distribution 201 (LSB=1), and if the target MSB value is 0, both the signals SMSB and SLSB will be at the supply voltage Vdd;

case 4: if the LSB is such that the threshold voltage of the selected memory cell belongs to the distribution 202 (LSB=0), and if the target MSB value is 0, the signal SLSB will be at the ground voltage, and the signal SMSB will be at the supply voltage Vdd.

Subsequently, the selected (even) bit line BLe is precharged to the supply voltage Vdd in the same way as in the LSB program operation case.

Before applying the programming voltage VPROG to the selected word line WL, the signal DATAPROG is asserted to the supply voltage Vdd, turning the transistors 276 on. Thus, the selected bit line BLe discharges to the ground voltage or not depending on the voltage values of the signals SMSB and SLSB (if the selected bit line BLe has a voltage equal to the supply voltage Vdd, the program is inhibited). More particularly, the selected bit line BLe discharges to the ground voltage (thus allowing to program the selected memory cell) if at least one among the signals SMSB and SLSB has a voltage that is equal to the supply voltage Vdd: if the signal SMSB is equal to the supply voltage Vdd, or if both the signals SMSB and SLSB are equal to the supply voltage Vdd, the node NOROUT is driven to the ground voltage by the NOR gate 278, and the bit line is discharged; otherwise, if both the signals SMSB and SLSB are at the ground voltage, the node NOROUT is driven to the supply voltage by the NOR gate 278, and the selected bit line remains at the supply voltage Vdd (the selected memory cell will not be programmed). It should be noted that the case in which the signal SMSB is at the ground voltage and the signal SLSB is at the supply voltage Vdd is not contemplated.

Even in the case of the MSB program operation, the phase wherein the selected word line WL is biased by the programming voltage is characterized by a repetition of a plurality of steps, each step including the application of a pulse of programming voltage VPROGR to the selected word line, which value increases at each step (up to a maximum value), and then the execution of a verify phase for assessing if the target threshold voltage value has been reached. More particularly, if a memory cell has to be programmed in such a way that its threshold voltage falls in the distribution 203 (MSB=0, LSB=0), the verify will be executed using a verify reading voltage VFY2 slightly higher then the read voltage VREAD2. Moreover, if a memory cell has to be programmed in such a way that its threshold voltage falls in the distribution 204 (MSB=0, LSB=1), the verify will be executed using a verify reading voltage VFY3 slightly higher then the read voltage VREAD3.

Since the verify operation includes a read operation, and since each of the LSB and MSB read operations needs a latch for storing the read result, both the latches 230-1 and 230-2 are necessary. The latch 230-1 has the function of verifying if the threshold voltage of the corresponding memory cell has reached or not the distribution 203 (MSB=0, LSB=0). For this purpose, the signal SMSB assumes the ground voltage, thus inhibiting the further programming of the memory cell, when the threshold voltage exceeds the verify reading voltage VFY2. Furthermore, the latch 230-2 has the function of verifying if the threshold voltage of the corresponding memory cell has reached or not the distribution 204 (MSB=0, LSB=1). For this purpose, the signal SLSB assumes the ground voltage, thus inhibiting the further programming, when the threshold voltage exceeds the verify reading voltage VFY3.

The MSB program operation involves all the memory cells of a selected page corresponding to a particular word line WL, and the corresponding read/program units 205. The loop comprising the repetition of program operations and verify phases ends when the nodes 237-1b (corresponding to the signals MLSB_N) and 237-2b (corresponding to the signals SLSB_N) of all the read/program units 205 of the page buffer 130 assume voltage values equal to the supply voltage Vdd: at this point, all the transistors 246 and 264 will be turned off, and the voltage values of the nodes MSBVER_N and LSB-VER_N will be brought to the ground voltage by means of the highly-resistive pull down circuits PDWN.

For speeding up the MSB program operation, it is possible to stop one of the two verify operations when all the cells of the selected page are verified as programmed to the target programming state corresponding to such verify operation. More particularly, the verify operation for the distribution 203 (that makes use of the verify reading voltage VFY2) stops when the signals SMSB_N of all the read/program units 205 are at the supply voltage Vdd, while the verify operation for the distribution 204 (that makes use of the verify reading voltage VFY3) stops when the signals SLSB_N of all the read/program units 205 are at the supply voltage Vdd.

Figure 2G:
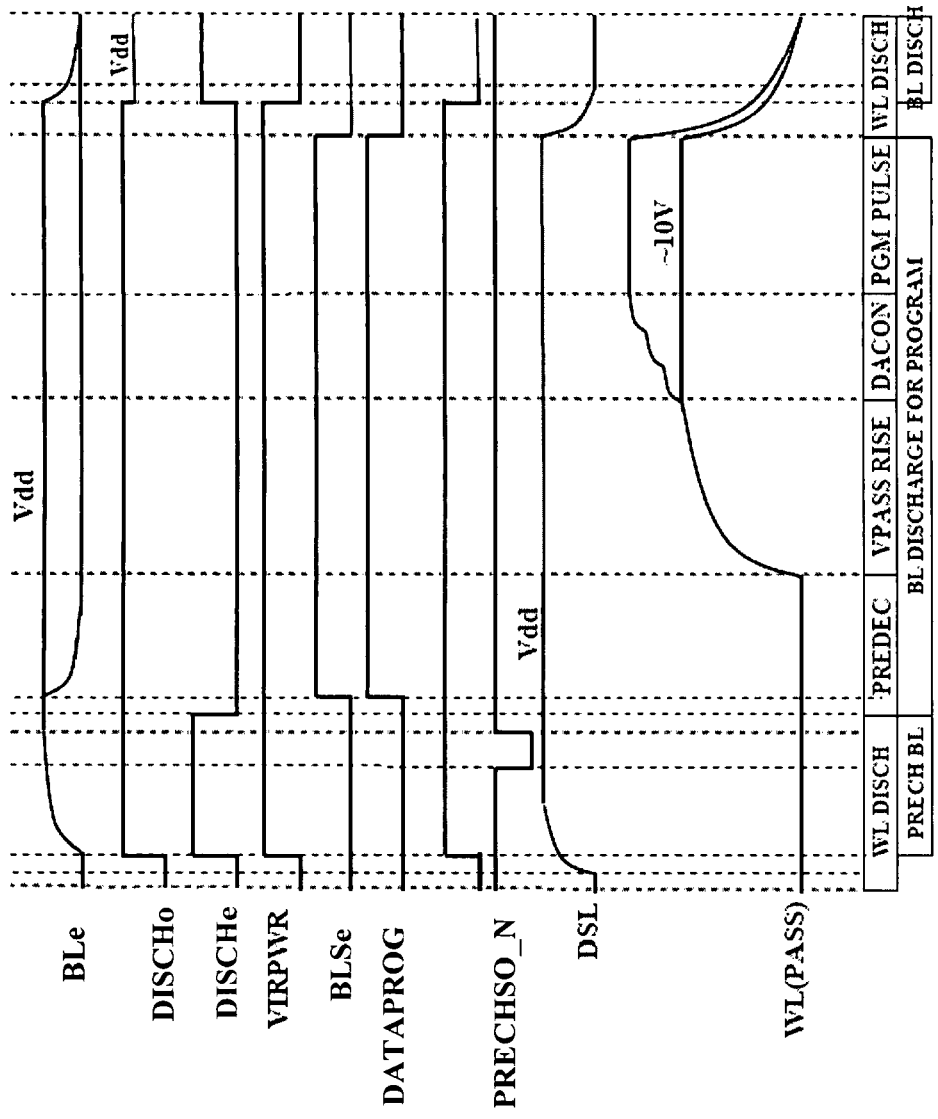
FIG. 2G illustrates a time diagram corresponding to an MSB program operation.
Figure 2H:
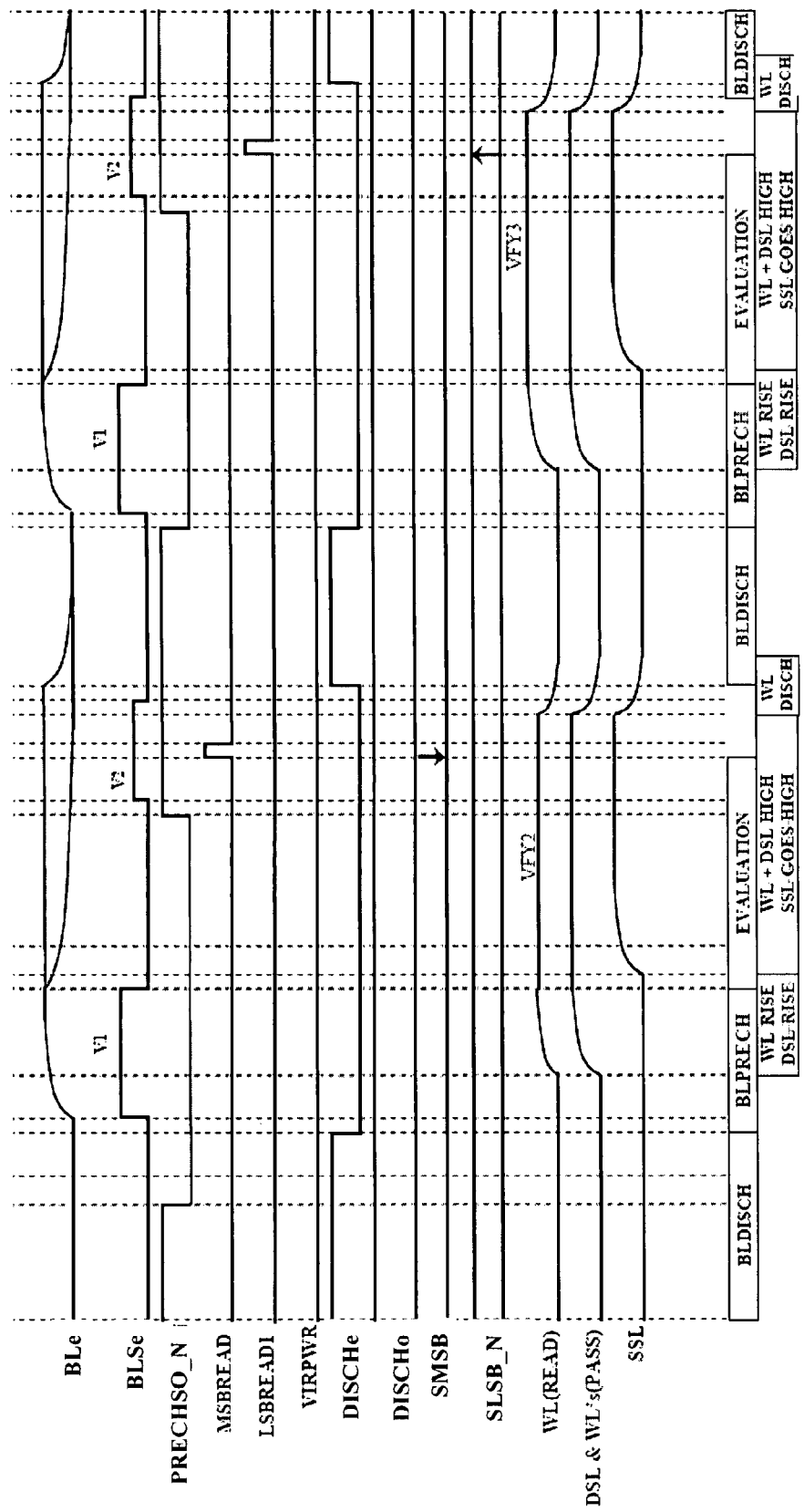
FIG. 2H illustrates a time diagram corresponding to an MSB verify.

In FIGS. 2G and 2H, two time diagrams showing the timing of a plurality of signals that are involved in the memory device during an MSB program operation and an MSB verify operation are respectively illustrated.

Erase Operation

As already discussed, the erase operation is necessary for bringing the threshold voltages of a block of memory cells 110 (i.e., all the memory cells corresponding to all the word lines of a string) to the erased state, i.e., to the distribution 201. For this purpose, the semiconductor well including all the cells of the matrix 105 is biased to the erase voltage VERASE, the word lines WL corresponding to the block are biased to the ground voltage, while the remaining word lines WL of the matrix 105 are kept floating.

Firstly, it is stored in the latch 230-1 an indication regarding the possible functional replacement of the corresponding bit lines, if defective, by redundant bit lines: if a bit line BL has a defect, it is highly probable that the memory cells 110 belonging to strings corresponding to said bit line BL are cannot be erased. Consequently, the verify performed by the read/program unit 205 corresponding to these bit lines will always fail. Thus, it is necessary to force said read/program units 205 corresponding to defected bit lines in such a way to provide a correct verify result.

If a bit line is defective, the signal SMSB is driven to the ground voltage GND, in such a way to treat the corresponding memory cells 110 as erased (having threshold voltages belonging to the distribution 201). On the contrary, if the bit line is not defective, and it is not functionally replaced by redundant bit lines, the signal SMSB is driven to the supply voltage Vdd.

The next step consists of setting the signal SLSB_N to the supply voltage (in this phase, the latch 230-2 is used for verify the erase operation).

Once the voltage pulse having the erase voltage VERASE is applied to the semiconductor well, a verify step is performed: such a verify is equal to a normal read operation, but with all the word lines WL belonging to the string biased to the ground voltage. If the memory cells of the string are sufficiently erased (i.e., their threshold voltage belong to the distribution 201), the node SO is discharged to the ground voltage, and thus the signal SLSB_N remains at the supply voltage Vdd. Conversely, if some of the memory cells of the string are not sufficiently erased, the node SO remains at the supply voltage Vdd, and thus, the signal SLSB_N pass to the ground voltage too, maintaining turned on the transistor 264 (erase operation not finished).

The read operations executed during the erase operation are performed using the latch 230-2, and are carried out both on the even bit lines BLe and on the odd bit lines BLo, without setting, between the two read operations, the signal SLSB_N to the supply voltage Vdd. In this way, the signal LSB_N remains at the supply voltage Vdd only if the memory cells connected to both the even and bit lines are sufficiently erased.

For controlling if the bit line has been functionally replaced by a redundant bit line, a data transfer is executed from the latch 230-1 to the latch 230-2, asserting the signal DATATRANS to the supply voltage Vdd. If the bit line has been replaced by a redundant one, the signal SLSB_N is brought again to the supply voltage Vdd. Conversely, if the bit line has not been functionally replaced by a redundant bit line, the signal SLSB_N remains as it was in the previous step.

The erase operation is successful if all the transistors 264 of the read/program units 205 remain turned off.

Soft Compression

After the erase operation, the threshold voltage distribution 201 that corresponds to the erased state may be too wide (i.e., it is dispersive). This has a negative impact on the time necessary for the subsequent program operations that involve the memory cells belonging to the erased block. For example, a memory cell having a too low threshold voltage requires more programming voltage VPROG pulses, compared to an erased memory cell having a higher threshold voltage.

A Soft Compression (SOC) operation may thus be performed, for compacting the distribution 201.

The SOC starts driving the signal SLSB to the ground voltage, as in the previous reset operations. Subsequently, a programming voltage VPROG pulse (similar to the ones previously described for the MSB and LSB program operations) is provided to all the word lines WL of the erased block. The programming voltage VPROG used in this operation has a value that is lower than the ones used for programming the MSB and the LSB.

Subsequently, a further verify operation is performed; said further verify operation is equal to the one previously described, i.e., with the word lines WL of the block that are biased to the ground voltage. Thus, a data transfer procedure is performed, in such a way to control if the bit lines corresponding to the string are functionally replaced by redundant bit lines (the latch 230-1 still stores the information about the redundancy, and it is not necessary to stores this information every time).

At this point, if all the transistors 264 of the read/program units 205 corresponding to the erased block are turned off (verify operation executed correctly), a further programming voltage VPROG pulse having an higher voltage respect to the ones of the preceding step is provided to all the word lines WL of the erased block.

The loop comprising said program and erase operations is performed until at least one transistor 264 is turned on.

After the SOC is performed, a further operation called Soft Erase Verify (SEV) is executed on the erased and Soft Compressed block of memory cells.

The SEV is a final verify operation, in which the word lines WL of the block are biased to a voltage that is slightly higher than the ground voltage (e.g., is equal to 0.4 Volts). In this way it is verified if the SOC operation succeeded in sufficiently compacting ("compressing") the distribution 201 (i.e., if the distribution 201 has not been shifted to excessively high voltage values).

If the SEV gives a positive result (i.e., all the transistors 264 are turned off), the block is verified erased, otherwise, the block is excluded from the matrix 105.

Concluding, from the previous description, it can be appreciated that during all the operations performed by the page buffer 130, the data transfer from the latch 230-1 to the latch 230-2 of each read/program unit 205 is directly performed by exploiting the transistors 272, 274, and not through the action of precharging/discharging a common node (i.e., the circuit node SO) coupling the outputs of the latches. In this way, the page buffer is able to operate safely, and is less affected by the drawbacks introduced by the presence of capacitive coupling with other signals of the page buffer. Moreover, having reduced the incidence of precharging operations of the circuit node SO, the page buffer 130 has the advantageous feature of saving electrical power.

Naturally, in order to satisfy local and specific requirements, a person skilled in the art may apply to the solution described above many modifications and alterations. Particularly, although the present invention has been described with a certain degree of particularity with reference to one or more embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, even though the present description makes reference to a four-level memory, the same considerations may apply if each cell is adapted to store a binary value formed by a generic even number of bits. In this case, each storage element of the read/program unit is adapted to store a number of bits equal to half the number of bits each cell is adapted to store.

The above-disclosed embodiments of the read/program unit may also be suitable to be implemented with other types of transistors, such as bipolar junction transistors.

Concepts of one or more embodiments of the present invention are also applicable if the read/program unit is structured in such a way that the data are loaded through the output terminal of the latch dedicated to store the LSB instead of through the latch dedicated to store the MSB. In this case, the read/program unit includes a data transfer structure adapted to allow the data transfer from the latch dedicated to store the LSB to the one dedicated to store the MSB.

Moreover, the one or more of the above-described embodiments of the read/program unit 205 may be included in an integrated circuit (IC), such as a non-volatile memory IC, which may be coupled to another IC, such as a controller, to compose all or part of an electronic system such as a computer system. Alternatively, the memory and controller, as well as other parts of the system, may be integrated on a single IC, such as in a system on a chip (SOC).

The invention claimed is:

1. A page buffer for an electrically programmable memory including:
   a plurality of memory cells,
   a plurality of distinct programming states defined for each memory cell, corresponding to a number N>=2 of data bits storable in each memory cell, wherein the data bits include at least a first data bits group and a second data bits group,
   at least one read/program unit having a coupling line operatively as sociable with selected memory cells, the read/program unit:
      being adapted to at least temporarily store data bits read from or to be written into selected memory cells;
      comprising programming state change enabling means for selectively enabling a change in programming state of a selected memory cell by causing the coupling line to take one among a program enabling potential and a program inhibition potential, wherein said programming state change enabling means comprises:
      reading means for retrieving, from the selected memory cell, an indication of an existing data value already stored in the second group of data bits;
      receiving means for receiving an indication of a target data value to be stored in the first group of data bits of the selected memory cell;
      combining means activatable during a combining phase for combining the indication of the existing data value with the indication of the received target data value, so as to obtain a modified indication corresponding to a target programming state for the memory cell; and
      conditioning means for causing a potential of the coupling line to take the program enabling potential or the program inhibition potential depending on the modified indication,
      wherein the combining means includes a coupling electrical path between the reading means and the receiving means, said coupling line being kept isolated from the coupling electrical path during said combining phase, wherein the receiving means includes a first latch for at least temporarily storing the indication of the target data value, for providing the stored indication to a first circuit node and for providing the logic complement of the stored indication to a second circuit node, and wherein the reading means further includes a second latch for at least temporarily storing the indication of the existing data value retrieved from the selected memory cell, and providing it to a third circuit node.

2. The page buffer of claim 1, wherein said conditioning means causes the potential of the coupling line to take the program enabling potential or the program inhibition potential also depending on the indication of the target data value.

3. The page buffer of claim 1, wherein the combining means includes a first transistor and a second transistor,
   the first transistor having a first conduction terminal connected to the third node, a second conduction terminal connected to a first conduction terminal of the second transistor and a control terminal connected to the second circuit node;
   the second transistor having a second conduction terminal receiving a first reference voltage and a control terminal arranged to receive a combining command asserted during the combining phase so as to provide the voltage at the second conduction terminal of the second transistor to the second conduction terminal of the first transistor.

4. The page buffer of claim 1, wherein the conditioning means includes:
   a logic joint denial circuit and a third transistor,
   the logic joint denial circuit having a first input terminal connected to the first circuit node, a second input terminal connected to the third circuit node and an output terminal connected to a first conduction terminal of the third transistor;
   the third transistor having a second conduction terminal connected to the coupling line and a control terminal being arranged to receive a program enabling signal during a program phase following said combining phase, so as to provide the voltage at the output terminal of the logic joint denial circuit to the coupling line.

5. The page buffer of claim 4, wherein the logic joint denial circuit includes a NOR logic gate.

6. The page buffer claim 1, wherein:
   said plurality of distinct programming states includes four programming states, and corresponds to a number N=2 of data bits, each data bit being capable to assume a first logic value ("0") and a second logic value ("1"), the first group of data bits and the second group of data bits including each a single first and, respectively, second data bit.

7. The page buffer of claim 6, wherein said four programming states include:
   a first programming state, corresponding to a first data bit having the second logic value, and to a second data bit having the second logic value;
   a second programming state, corresponding to a first data bit having the second logic value, and to a second data bit having the first logic value;
   a third programming state, corresponding to a first data bit having the first logic value, and to a second data bit having the first logic value; and
   a fourth programming state, corresponding to a first data bit having the first logic value, and to a second data bit having the second logic value.

8. The page buffer of claim 7, wherein:
   the second latch is adapted to drive the third circuit node to a selected one among the first reference voltage or a second reference voltage in case the indication of the existing data value stored in and retrieved from the second data bit of the selected memory cell is equal to the first logic value or, respectively, to the second logic value.

9. The page buffer of claim 8, wherein:

the first latch is adapted to drive the first circuit node to a selected one among the first reference voltage or the second reference voltage in case the target data value to be stored in the first data bit is equal to the second logic value or, respectively, to the first logic value.

10. The page buffer of claim 8, wherein:

said program enabling potential corresponds to the first reference voltage; and said program inhibition potential corresponds to the second reference voltage.

* * * * *